United States Patent
Xie et al.

(10) Patent No.: US 12,489,053 B2
(45) Date of Patent: Dec. 2, 2025

(54) INTERCONNECT STRUCTURE INCLUDING PATTERNED METAL LINES

(71) Applicant: International Business Machines Corporation, Armonk, NY (US)

(72) Inventors: Ruilong Xie, Niskayuna, NY (US); Chanro Park, Clifton Park, NY (US); Julien Frougier, Albany, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 631 days.

(21) Appl. No.: 17/844,562

(22) Filed: Jun. 20, 2022

(65) Prior Publication Data
US 2023/0411286 A1    Dec. 21, 2023

(51) Int. Cl.
| | | |
|---|---|---|
| *H01L 23/528* | (2006.01) | |
| *H01L 21/768* | (2006.01) | |
| *H01L 23/522* | (2006.01) | |
| *H01L 23/532* | (2006.01) | |

(52) U.S. Cl.
CPC .... *H01L 23/5283* (2013.01); *H01L 21/76885* (2013.01); *H01L 23/5226* (2013.01); *H01L 23/53257* (2013.01)

(58) Field of Classification Search
CPC ........... H01L 23/5283; H01L 21/76885; H01L 23/5226; H01L 23/53257; H01L 21/76897; H01L 23/53242
See application file for complete search history.

(56) References Cited

U.S. PATENT DOCUMENTS

| | | | |
|---|---|---|---|
| 8,357,609 B2 | 1/2013 | Ryan | |
| 9,048,292 B2 | 6/2015 | Sipani | |
| 9,601,426 B1 | 3/2017 | Bonilla | |
| 10,199,235 B2 | 2/2019 | Wu | |
| 2012/0078582 A1 | 3/2012 | Duncan Mattson et al. | |
| 2012/0098133 A1 | 4/2012 | Yang et al. | |
| 2013/0193579 A1 | 8/2013 | Ponoth et al. | |
| 2016/0056104 A1 | 2/2016 | Bouche et al. | |

(Continued)

FOREIGN PATENT DOCUMENTS

| | | |
|---|---|---|
| CN | 101052269 B | 7/2010 |
| CN | 104167395 A | 11/2024 |

OTHER PUBLICATIONS

Clark, R., Tapily, K., Yu, K. H., Hakamata, T., Consiglio, S., O'Meara, D., . . . & Leusink, G. (2018). Perspective: New process technologies required for future devices and scaling. APL Materials, 6(5), 058203. May 29, 2018. pp. 058203-1 to 058203-12.

(Continued)

*Primary Examiner* — Karen Kusumakar
(74) *Attorney, Agent, or Firm* — Samuel Waldbaum; Otterstedt & Kammer PLLC (57) ABSTRACT

Interconnect structures including parallel metal lines and cut regions in selected ones of the parallel metal lines are fabricated without damage, even at a very small metal pitch. A dielectric fill in the cut regions has a smaller width than the width of the metal lines. Metal line width can be increased by selective metal deposition on sidewalls of the metal lines subsequent to forming the cut regions.

20 Claims, 5 Drawing Sheets

(56) References Cited

U.S. PATENT DOCUMENTS

2020/0083350 A1 3/2020 Bao et al.
2020/0381296 A1* 12/2020 Fan .................. H01L 21/76877

OTHER PUBLICATIONS

Hari, S., Hagen, C. W., Verduin, T., & Kruit, P. (2014). Size and Shape Control of Sub-20 nm Patterns Fabricated Using Focused Electron Beam-Induced Processing. Journal of Micro/ Nanolithography, MEMS, and MOEMS, 13(3), 033002. Jul.-Sep. 2014 pp. 033002-1 Through 033002-7.

Luo, S., Hoff, B. H., Maier, S. A., & de Mello, J. C. (2021). Scalable Fabrication of Metallic Nanogaps at the Sub-10 nm Level. Advanced Science, 2102756. 25 Pages. Dec. 2021.

Nedelcu, M., Saifullah, M. S., Hasko, D. G., Jang, A., Anderson, D., Huck, W. T., . . . & Steiner, U. (Jul. 23, 2010). Fabrication of Sub-10 nm Metallic Lines of Low Line-Width Roughness by Hydrogen Reduction of Patterned Metal- Organic Materials. Advanced Functional Materials, 20(14), pp. 2317-2323.

* cited by examiner

INTERCONNECT STRUCTURE INCLUDING PATTERNED METAL LINES

BACKGROUND

The present invention relates generally to the electrical, electronic and computer arts and, more particularly, to interconnect structures and their fabrication.

Silicon-based devices typically include multiple interconnect metallization layers above a device (front-end-of-line/ FEOL) layer that contains field-effect transistors (FETs) and/or other structures. FEOL processing includes high-temperature steps for manipulating semiconductor conductivity. Middle-of-line (MOL) processing includes steps typically used for fabricating metal contacts for logic circuitry components such as field-effect transistors (FETs), resistors, diodes, and capacitors. MOL processing may include intermediate-temperature steps for forming semiconductor-metal compounds (for example, silicides, germanosilicides) for electrical contacts. Back-end-of-line (BEOL) processing involves the creation of metal interconnecting wires that connect the devices formed in FEOL processing to form electrical circuits and may include silicidation as discussed above with respect to MOL processing. The metal lines including the interconnecting wires are deposited in sequence (e.g. M1, M2, M3, etc.) above the FEOL layer and include dielectric layers. The interconnecting wires within each metal line are electrically connected to interconnecting wires in other metal lines and to the devices in the FEOL layer. BEOL processing typically includes low-temperature steps for forming metal wires and preserving temperature sensitive FEOL and MOL structures.

BEOL processing involves the formation of interconnect layers above the MOL layers. A chip may have multiple BEOL interconnect layers. Each interconnect layer, which has a wiring scheme, is connected to another interconnect layer by vias. The wires and vias are within dielectric layers, one or more of which may comprise low-k material.

BRIEF SUMMARY

Interconnect structures having metal wires and one or more cuts extending through the metal wires are provided. An interconnect structure in accordance with an exemplary embodiment of the invention includes an interlevel dielectric layer comprising low-k dielectric material and metal interconnect wires within the interlevel dielectric layer. The metal interconnect wires have a first width dimension. A cut region extends through at least one of the metal interconnect wires and divides the at least one of the metal interconnect wires into first and second wire segments. A dielectric fill within the cut region has a second width dimension smaller than the first width dimension.

In a further aspect of the invention, a semiconductor structure includes a semiconductor device layer and an interconnect structure positioned over and electrically connected to the semiconductor device layer. The interconnect structure includes an interlevel dielectric layer comprising low-k dielectric material and metal interconnect wires within the interlevel dielectric layer. The metal interconnect wires have a first width dimension. A cut region extends through at least one of the metal interconnect wires and divides the at least one of the metal interconnect wires into first and second wire segments. A dielectric fill within the cut region has a second width dimension smaller than the first width dimension.

A method of forming an interconnect layer over a semiconductor device layer includes forming parallel metal interconnect wires having an initial width dimension over the semiconductor device layer, forming a cut region extending through at least one of the parallel metal interconnect wires and dividing the at least one of the parallel metal interconnect wires into first and second wire segments, and depositing a dielectric fill within the cut region. The dielectric fill has a width dimension equal to the initial width dimension of the parallel metal interconnect wires. The method further includes selectively growing metal layers on the parallel metal interconnect wires, thereby increasing the initial width dimension of the parallel metal interconnect wires to a first width dimension exceeding the width dimension of the dielectric fill.

Techniques and structures as disclosed herein can provide substantial beneficial technical effects. By way of example only and without limitation, one or more embodiments may provide one or more of the following advantages:
  Facilitating metal wire cuts in closely spaced metal wires without damage to adjoining wires;
  Facilitating metal wire and via fabrication;
  Small metal wire pitch;
  Allowing chip area shrink.
These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

A CMOS device may include a group of transistor and interconnect structures that provides a logic function or a storage function. A cell design may include, for example, active, gate, and metal levels. The interconnect structures may include power lines (Vss and Vdd) as well as signal lines within dielectric layers. Semiconductor devices such as CMOS devices now often require narrow metal lines and tight metal line pitches. As metal pitch scales to sub-20 nm, metal patterning can be difficult.

Figure 1A:
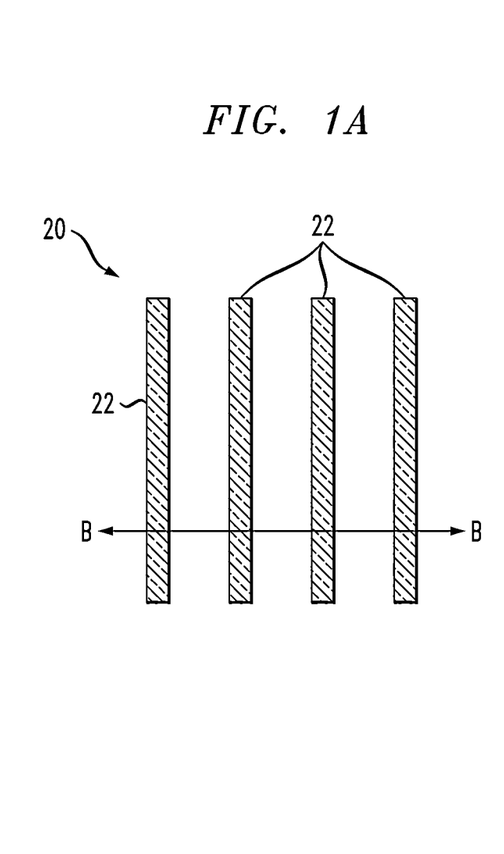
FIG. 1A is a schematic, top plan view showing a portion of a semiconductor structure following formation of metal wires thereon.
Figure 1B:
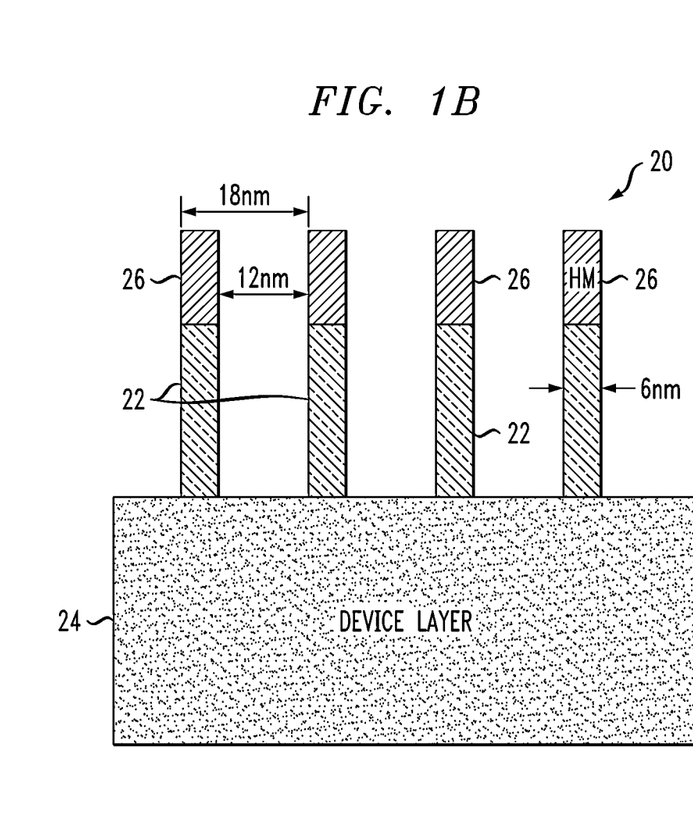
FIG. 1B is a schematic, cross-sectional view showing the semiconductor structure of FIG. 1A taken along line B-B of FIG. 1A.

A semiconductor structure 20 as schematically illustrated in FIG. 1A and FIG. 1B is formed following FEOL/MOL processing and the patterning of a metal layer to form metal wires 22 for a metallized interconnect layer that is completed later in the fabrication process. The semiconductor structure includes a device (FEOL/MOL, or lower BEOL levels) layer 24 and metal wires 22 over the device layer. One or more of the metal wires 22 may be electrically connected to the device layer 24.

The metal wires 22 are formed from a metal layer deposited as a blanket layer (not shown) on the device layer 24. A patterning stack including a hard mask 26 and a lithographic mask (not shown) is formed on the hardmask layer followed by etching steps. Hard mask material such as silicon nitride (SiN) or silicon dioxide (SiO$_2$) can be employed. A photoresist layer (not shown) may be applied over the hard mask. The photoresist can be applied by any suitable technique, including, but not limited to coating or spin-on techniques. A mask (not shown), which is patterned with shapes defining trenches to be formed, is provided over the photoresist, and the mask pattern is transferred to the photoresist using a photolithographic process, which creates recesses in the uncovered regions of the photoresist. The patterned photoresist is subsequently used to create the same pattern of trenches within the hard mask through conventional etching typically used for forming trenches. Dry etch (for example, a reactive ion etch) techniques may be employed to form parallel, longitudinal trenches within the hard mask. A fin-like pattern of hard mask material is thereby formed over the metal layer.

After formation of trench openings in the hard mask, the photoresist may be stripped by ashing or other suitable process. The resulting structure may be subjected to a directional etch to remove unprotected portions of the metal layer. Fin-like metal wires 22 having dielectric caps 26 of hard mask material thereon extend vertically with respect to the device layer 24 following the directional etch, as schematically illustrated in FIG. 1B. (The dielectric caps 26 are not shown in FIG. 1A.) In an exemplary embodiment, the metal layer from which the metal wires are formed comprises an adhesion layer and a bulk electrically conductive metal. The adhesion layer, which is applied directly upon the device layer 24, may be a titanium nitride (TiN) layer or other suitable metal layer. A conformal layer of adhesion layer material may be deposited using known techniques such as CVD, ALD, or PVD. A ruthenium (Ru) layer or other suitable electrically conductive metal or metals may be formed on the adhesion layer. Metals such as ruthenium may be deposited using chemical vapor deposition, atomic layer deposition, or physical vapor deposition (PVD) to form a metal layer from which metal wires can be formed.

Referring again to the semiconductor structure 20 shown in FIG. 1B, the hard mask is patterned such that the widths of the metal wires 22 that are formed using the hard mask are less than the widths that are ultimately desired for such metal wires. There are accordingly wider spaces between the metal wires 22 than would be obtained if wider metal wires were formed, assuming the same wire pitch. A dry etch of a metal layer may be difficult if small trenches are to be formed in the metal layer. Specifically, it may be difficult to control the etch profile of the metal layer in sub-20 nm pitch scales. Moreover, the risks of generating defects in forming the metal wires are relatively high. Relatively wide spaces between hard mask portions facilitate the etch process, but the metal wire CD (critical dimension) is reduced. For example, if the metal wires have desired widths of ten nanometers and are to be formed eight nanometers apart to obtain an eighteen nanometer pitch, the etch process would be facilitated by forming metal wires having reduced widths but possibly sacrificing performance due to decreases in metal width. The process described herein facilitates the dry etch of the metal layer and allows the formation of relatively thin metal wires without sacrificing performance of the interconnect layer that is ultimately provided. The heights of the metal wires 22 at this stage of the process correspond to the combined heights (Mx+Vx) of the metal wires of the final interconnect structure and the via connectors to be formed later in the process from selected portions of the metal wires 22. In an exemplary embodiment, metal wire height at this stage of the process may be in the range of thirty to one hundred nanometers (30-100 nm).

The processes disclosed herein further facilitate cutting of the metal wires 22. The cutting of one or more of such wires may be required by the design of an integrated circuit. If the metal wire pitch is small, for example less than twenty nanometers, and the spacing between metal wires is also relatively small, damage to one or more adjoining metal lines is possible in the absence of ideal metal cut alignment. In an exemplary embodiment of the invention, metal wires 22 are fabricated having widths of six nanometers, metal wire spacing of twelve nanometers, and a wire pitch of eighteen nanometers. Such wire spacing and relatively small wire width allows wire cutting without damage to adjoining wire lines even if metal cut alignment is imperfect or worse.

Figure 2A:
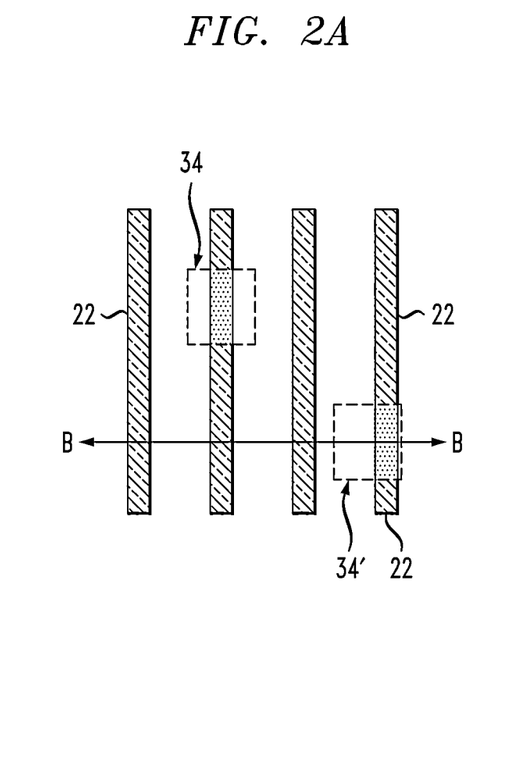
FIG. 2A is a schematic, top plan view showing the semiconductor structure of FIG. 1A following formation of cut regions in selected metal wires and deposition of a sacrificial layer.
Figure 2B:
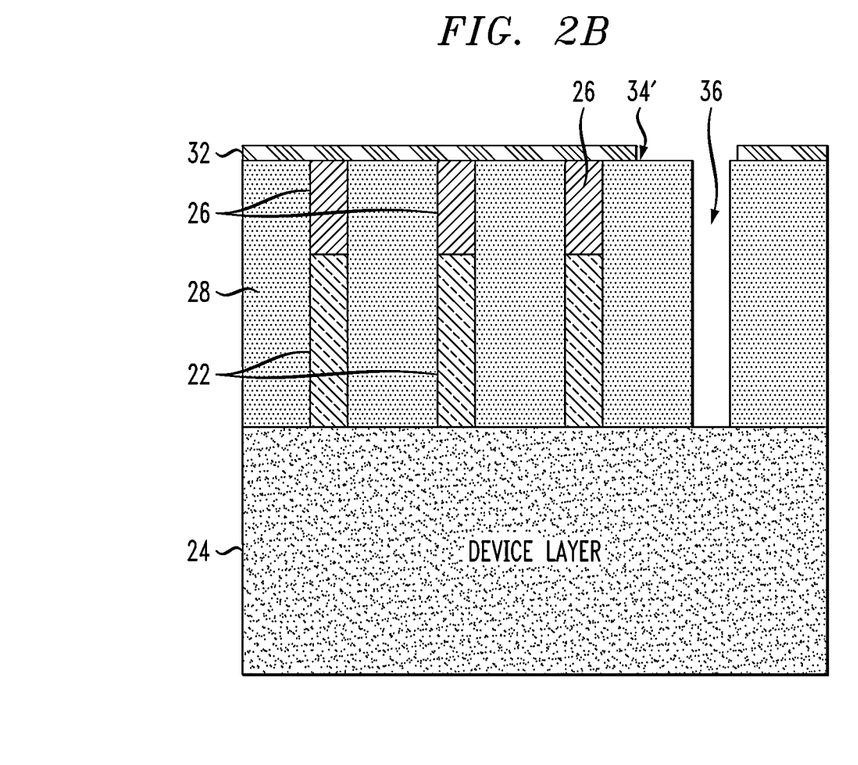
FIG. 2B is a schematic, cross-sectional view taken along line B-B of FIG. 2A.

Referring to FIG. 2A and FIG. 2B, a layer 28 of sacrificial material (for example, an organic planarization layer or OPL) is deposited over the metal wires 22 and device layer 24. The layer 28 fills the spaces between the metal wires 22 and the dielectric caps 26 on the metal wires. The layer 28 of sacrificial material is planarized down to the top surfaces of the dielectric caps 26 formed from the originally deposited hard mask. A second hard mask 32 on the layer 28 is patterned using, for example, lithographic techniques as discussed above. Openings in the hard mask 32 are ideally centered on portions of selected metal wires 22. As illustrated in FIGS. 2A and 2B, one of the openings 34 in the hard mask 32 is correctly aligned with a metal wire 22 while a second opening 34' therein is not. Because the metal wires are relatively thin and well-spaced with respect to each other, the misaligned opening 34' is still positioned completely over a portion of a targeted metal wire and associated dielectric cap without also extending over the adjoining, untargeted metal wire. A relatively small metal line CD (critical dimension) further allows a relatively small cut CD, thereby reducing the possibility of damage to a neighboring metal line in the event of misalignment. The portions of the metal wires aligned with the openings 34, 34' are removed down to the device layer 24. Selected metal wires 22 are thereby cut, leaving trenches 36 within the layer 28 of sacrificial material and between opposing segments of the cut metal wires.

Figure 3A:
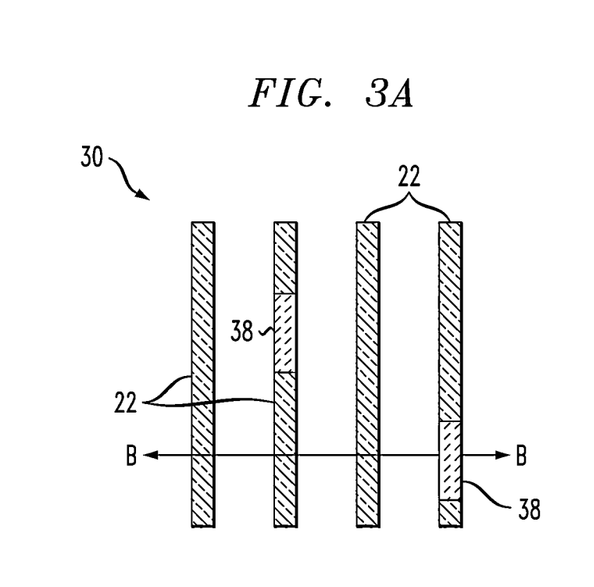
FIG. 3A is a schematic, top plan view showing the semiconductor structure of FIG. 2A following deposition of a dielectric material within the cut regions and removal of the sacrificial layer.
Figure 3B:
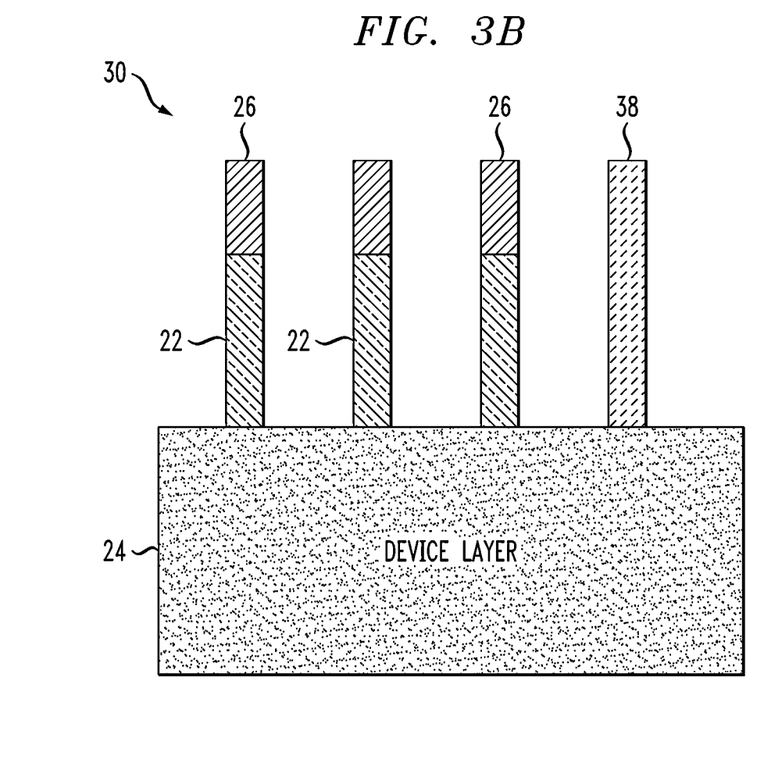
FIG. 3B is a schematic, cross-sectional view taken along line B-B of FIG. 3A.

The trenches 36 and the cut regions of the metal wires 22 are filled with a dielectric material. The dielectric fill 38 may comprise SiN, $AlO_x$, $AlN_x$ or other suitable electrically insulating material. Excess dielectric fill material is etched down to the top surfaces of the dielectric caps 26. The layer 28 of sacrificial material is then selectively removed to obtain a structure 30 as schematically illustrated in FIG. 3A and FIG. 3B. The width of the dielectric fill 38 is the same as the width of the metal wires 22. The dielectric fill 38 electrically isolates the opposing ends of segments of the metal wires 22 that include cut regions.

Figure 4A:
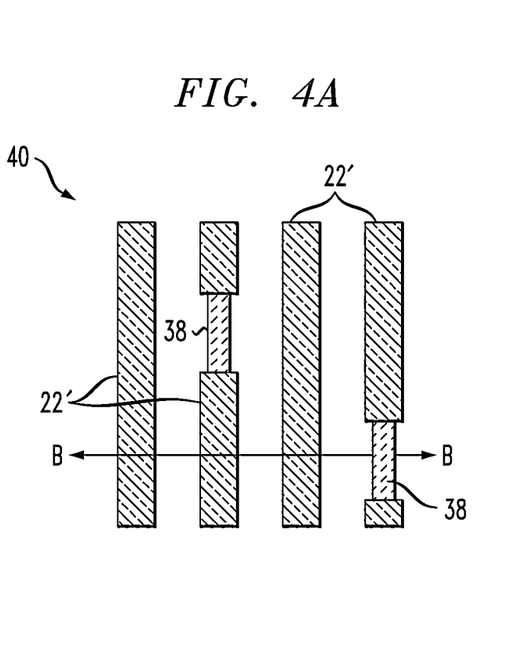
FIG. 4A is a schematic, top plan view showing the semiconductor structure of FIG. 3A following selective metal growth on the metal wires.
Figure 4B:
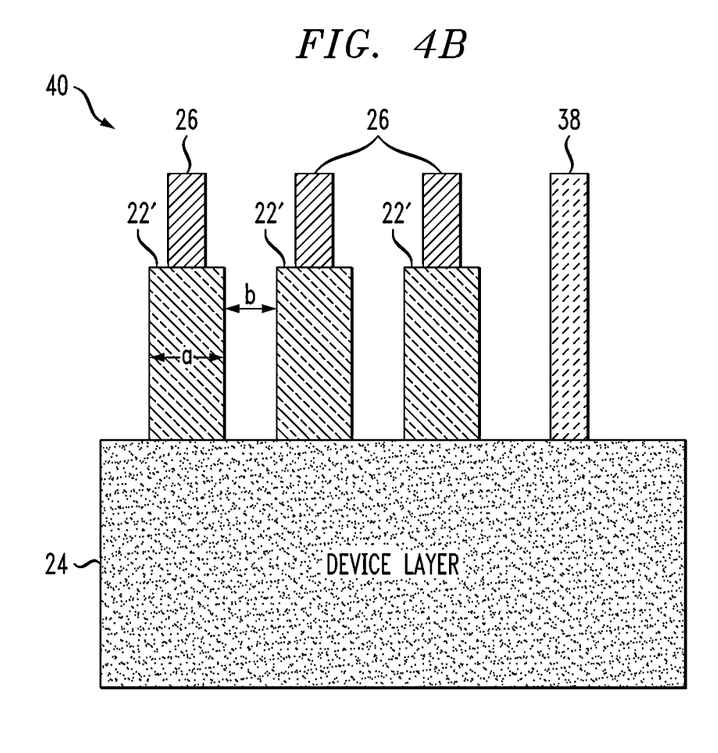
FIG. 4B is a schematic, cross-sectional view taken along line B-B of FIG. 4A.

As discussed above, the widths of the metal wires 22 may be smaller than desired for the interconnect layer to be formed on the device layer 24. Metal layers are selectively grown on the sidewalls of the metal wires 22 to increase the widths thereof. In an exemplary embodiment, ruthenium is grown to a thickness of two nanometers (2 nm) on each of the metal wire sidewalls to form thicker metal wires 22' having widths (a) of ten nanometers (10 nm), as schematically illustrated in FIG. 4B. The space (b) between each of the thicker, parallel metal wires 22' is decreased to eight nanometers following metal deposition. In an exemplary embodiment, ruthenium layers are grown on the sidewalls of ruthenium metal wires 22 using known techniques such as CVD, ALD, or PECVD. In other embodiments, different metal layers can grow selectively to increase the metal line CD, such as Co or W. As metal deposition is selective, the width of the dielectric fill 38 within the metal cuts remains the same and the ends of the metal wire segments adjoining the cuts remain electrically isolated from each other. The dielectric isolation between metal wire segments is at least eight nanometers (8 nm) in one or more embodiments. The presence of the dielectric fill 38 during metal wire sidewall growth ensures this amount of separation between metal wire segments is maintained. The width of the thicker metal wires 22' accordingly exceeds the width of the dielectric fill 38 that electrically isolates segments of such wires 22', as best illustrated in FIG. 4A. A structure 40 as schematically illustrated in FIG. 4A and FIG. 4B is accordingly obtained.

As discussed above, the metal wires 22 as formed and later as widened have heights than are greater than required for the metal wire portions (Mx) of the interconnect structure. As vias are only required in selected locations, a via keep mask (not shown) is employed to mask the region(s) of the metal wires 22' over which one or more vias are needed. The unprotected (unmasked) regions of the metal wires 22' are recessed to the desired Mx height by a plasma dry etch process. The protected (masked) regions form top vias 42 integral with and extending vertically from selected metal wires 22' and have heights equal to the Mx+Vx heights.

Figure 5A:
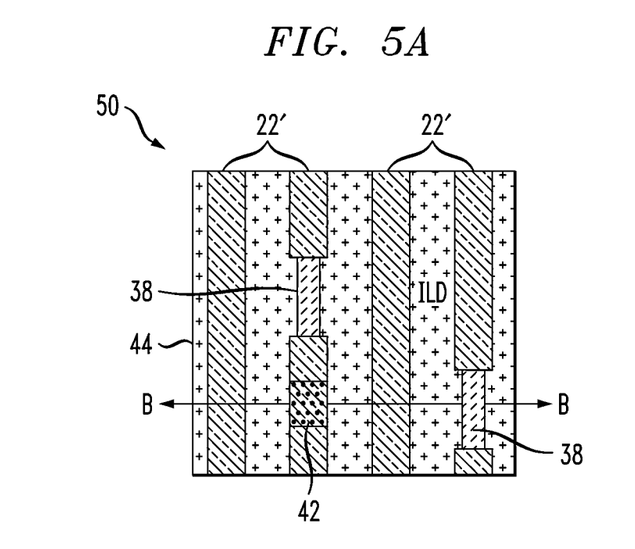
FIG. 5A is a schematic, top plan view showing the semiconductor structure of FIG. 4A following via formation, deposition of an interlevel dielectric (ILD) layer and planarization.
Figure 5B:
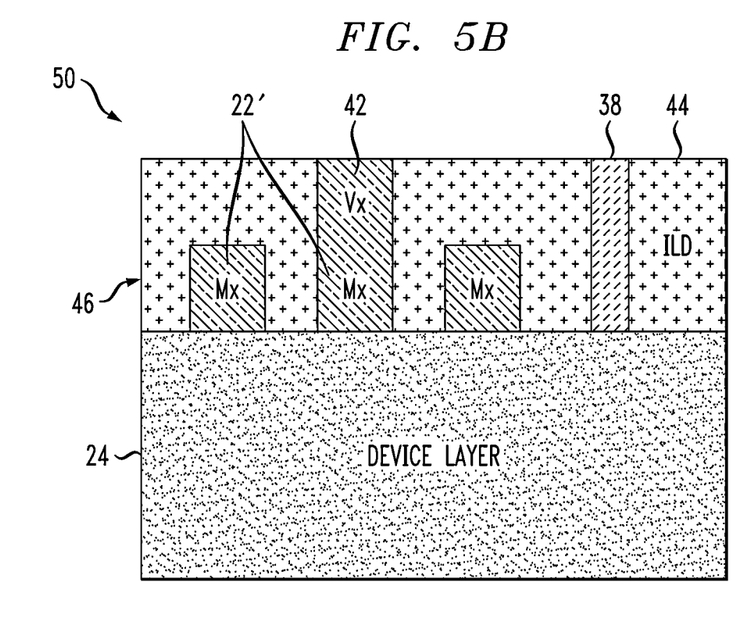
FIG. 5B is a schematic, cross-sectional view taken along line B-B of FIG. 5A.

An ILD layer 44 is deposited over the device layer 24, the metal wires 22' and the top vias 42 using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The ILD layers may include, but are not necessarily limited to, low-k materials (e.g., k less than about 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. An SiCOH dielectric film having a dielectric constant (k) of about 2.7-2.8 can, for example, comprise one or more ILD layers. Such a dielectric film can be deposited using PECVD. ILD layers may, in some embodiments, comprise an ultra low-k (ULK) dielectric material having a dielectric constant of 2.5 or below. The ILD layer comprises multiple layers in some embodiments. A thin silicon nitride liner is deposited over the device layer 24 and the metal wires 22' prior to deposition of the ILD layer in some exemplary embodiments. The ILD layer is planarized using a chemical mechanical polishing process (CMP) down to the top surfaces of the vias 42. Such planarization further allows removal of the dielectric caps 26 and top portions of the dielectric fill 38. A semiconductor structure 50 as schematically illustrated in FIG. 5A and FIG. 5B is accordingly obtained.

The exemplary semiconductor structure 50 includes a device layer 24 and an interconnect layer 46 electrically connected thereto. The interconnect layer comprises an array of parallel metal wires 22' and one or more vias 42 extending vertically with respect to selected metal wire(s) within the array. The metal wires and vias are embedded within an ILD layer. One or more of the metal wires 22' includes a cut region. A dielectric fill 38 within the cut region electrically isolates segments of the one or more metal wires 22'. The metal wires 22' have a first CD while the dielectric fill has a second CD. The first CD is at least two nanometers (2 nm) greater than the second CD in an exemplary embodiment, and can be 50% or more greater than the second CD. For example, the width of each metal wire 22' within the array may be ten nanometers while the width of the dielectric fill may be six nanometers. Wire pitch is less than thirty nanometers in one or more embodiments, and less than twenty nanometers in some embodiments. Via width is the same as the metal wire width in the exemplary structure shown in FIG. 5B. In some exemplary embodiments, the interconnect layer 44 forms an M2/V1 layer. In other words, it is the second layer or level of the structure to include metal wiring, but the first level to include one or more vias. It will be appreciated that a semiconductor structure may include multiple interconnect layers in addition to that shown in the exemplary figures. Additional interconnect layers may or may not be formed using techniques as described herein.

Interconnect structures 50 as described herein facilitate adoption of scaled down technology nodes. The processes described herein may, if desired, employ currently existing metal deposition and metal etch processes, allowing their implementation within existing facilities using existing tooling. It will be appreciated that new deposition and etch processes having application to the processes discussed herein may be developed and adopted.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling 1st Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures including interconnect layers and associated structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below", "top" and "bottom", and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. An interconnect structure comprising:
    an interlevel dielectric layer comprising low-k dielectric material;
    metal interconnect wires within the interlevel dielectric layer, the metal interconnect wires having a first width dimension;

a cut region extending through at least one of the metal interconnect wires and dividing the at least one of the metal interconnect wires into first and second wire segments; and a dielectric fill within the cut region, the dielectric fill having a second width dimension smaller than the first width dimension.

2. The interconnect structure of claim 1, wherein the metal interconnect wires form a parallel array.

3. The interconnect structure of claim 2, wherein the metal interconnect wires have a pitch of less than thirty nanometers.

4. The interconnect structure of claim 2, wherein the dielectric fill and the interlevel dielectric layer comprise a first dielectric material and a second dielectric material, respectively, the first dielectric material being different from the second dielectric material.

5. The interconnect structure of claim 4, wherein the first width dimension is at least two nanometers greater than the second width dimension.

6. The interconnect structure of claim 5, wherein the metal interconnect wires have a pitch of less than twenty nanometers.

7. The interconnect structure of claim 6, further including at least one via integral with and extending vertically from one of the metal interconnect wires, wherein the at least one via has a width equal to the first width dimension.

8. The interconnect structure of claim 7, wherein the metal interconnect wires comprise ruthenium.

9. The interconnect structure of claim 8, wherein dielectric fill extends from a bottom surface of the interlevel dielectric layer to a top surface of the interlevel dielectric layer.

10. A semiconductor structure comprising:
a semiconductor device layer; and
an interconnect structure positioned over and electrically connected to the semiconductor device layer, the interconnect structure comprising:
an interlevel dielectric layer comprising low-k dielectric material;
metal interconnect wires within the interlevel dielectric layer, the metal interconnect wires having a first width dimension;
a cut region extending through at least one of the metal interconnect wires and dividing the at least one of the metal interconnect wires into first and second wire segments; and
a dielectric fill within the cut region, the dielectric fill having a second width dimension smaller than the first width dimension.

11. The semiconductor structure of claim 10, wherein the metal interconnect wires form a parallel array.

12. The semiconductor structure of claim 11, wherein the metal interconnect wires have a pitch of less than thirty nanometers.

13. The semiconductor structure of claim 12, wherein the dielectric fill and the interlevel dielectric layer comprise a first dielectric material and a second dielectric material, respectively, the first dielectric material being different from the second dielectric material.

14. The semiconductor structure of claim 13, wherein the first width dimension is at least two nanometers greater than the second width dimension.

15. The semiconductor structure of claim 14, further including at least one via integral with and extending vertically from one of the metal interconnect wires, wherein the at least one via has a width equal to the first width dimension.

16. The semiconductor structure of claim 14, wherein the metal interconnect wires comprise ruthenium.

17. A method of forming an interconnect layer over a semiconductor device layer, comprising:
forming parallel metal interconnect wires having an initial width dimension over the semiconductor device layer;
forming a cut region extending through at least one of the parallel metal interconnect wires and dividing the at least one of the parallel metal interconnect wires into first and second wire segments;
depositing a dielectric fill within the cut region, the dielectric fill having a width dimension equal to the initial width dimension of the parallel metal interconnect wires;
selectively growing metal layers on the parallel metal interconnect wires, thereby increasing the initial width dimension of the parallel metal interconnect wires to a first width dimension exceeding the width dimension of the dielectric fill.

18. The method of claim 17, further including encasing the parallel metal interconnect wires with a low-k interlevel dielectric layer.

19. The method of claim 17, further including forming the parallel metal interconnect wires at a sub-thirty nanometer pitch.

20. The method of claim 19, further including forming vias from the parallel metal interconnect wires by recessing selected portions of the parallel metal interconnect wires.

* * * * *